(12) United States Patent
Abbondanza

(10) Patent No.: US 9,576,793 B2
(45) Date of Patent: Feb. 21, 2017

(54) SEMICONDUCTOR WAFER AND METHOD FOR MANUFACTURING THE SAME

(71) Applicant: STMICROELECTRONICS S.R.L., Agrate Brianza (IT)

(72) Inventor: Giuseppe Abbondanza, San Giovanni la Punta (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/788,699

(22) Filed: Jun. 30, 2015

(65) Prior Publication Data

US 2015/0325656 A1  Nov. 12, 2015

Related U.S. Application Data

(62) Division of application No. 13/695,246, filed as application No. PCT/EP2011/056817 on Apr. 29, 2011, now Pat. No. 9,099,308.

(30) Foreign Application Priority Data

Apr. 29, 2010  (IT) ............................... CT2010A0006

(51) Int. Cl.
| | | |
|---|---|---|
| *H01L 29/16* | (2006.01) | |
| *H01L 21/02* | (2006.01) | |
| *H01L 29/20* | (2006.01) | |
| *H01L 29/267* | (2006.01) | |

(52) U.S. Cl.
CPC ..... *H01L 21/02529* (2013.01); *H01L 21/0254* (2013.01); *H01L 21/02381* (2013.01); *H01L 21/02447* (2013.01); *H01L 21/02532* (2013.01); *H01L 21/02598* (2013.01); *H01L 21/02658* (2013.01); *H01L 29/1608* (2013.01); *H01L 29/2003* (2013.01); *H01L 29/267* (2013.01)

(58) Field of Classification Search
CPC ................. H01L 29/1608; H01L 21/02; H01L 29/66068; H01L 29/2003; H01L 29/78; H01L 21/02529
USPC ............................. 257/77, 76, 183, 628, 194
See application file for complete search history.

(56) References Cited

U.S. PATENT DOCUMENTS

| | | |
|---|---|---|
| 5,471,946 A | 12/1995 | Scholz et al. |
| 5,952,679 A | 9/1999 | Kitou et al. |
| 6,011,261 A | 1/2000 | Ikeda et al. |

(Continued)

OTHER PUBLICATIONS

Cordier et al., "AlGaN/GaN high electron mobility transistors grown on 3C—SiC/Si(111)", Journal of Crystal Growth 310, 2008, pp. 4417-4423.

(Continued)

*Primary Examiner* — Chuong A Luu
*Assistant Examiner* — Rodolfo D Fortich
(74) *Attorney, Agent, or Firm* — Allen, Dyer, Doppelt, Milbrath & Gilchrist, P.A.

(57) ABSTRACT

An embodiment of a method for manufacturing a semiconductor wafer includes providing a monocrystalline silicon wafer, epitaxially growing a first layer of a first material on the silicon wafer, and epitaxially growing a second layer of a second material on the first layer. For example, said first material may be monocrystalline silicon carbide, and said second material may be monocrystalline silicon.

27 Claims, 1 Drawing Sheet

(56) References Cited

U.S. PATENT DOCUMENTS

| | | | |
|---|---|---|---|
| 6,110,279 A * | 8/2000 | Kito | C30B 23/00 117/105 |
| 6,323,109 B1 | 11/2001 | Okonogi | |
| 2005/0020094 A1 | 1/2005 | Forbes et al. | |
| 2006/0220192 A1 | 10/2006 | Kurachi et al. | |
| 2010/0291761 A1 | 11/2010 | Storck et al. | |

OTHER PUBLICATIONS

Gourbeyre et al., "Correlation between epitaxial growth conditions of 3C—SiC thin films on Si and mechanical behavior of 3C—SiC self-suspended membranes", E-MRS Proceedings of Symposium J: Materials in Microtechnologies and Microsystems, vol. A99, No. 1-2, Jun. 2001, pp. 31-34.

Ikoma et al., "Growth of Si/3C—SiC/Si(100) heterostructures by pulsed supersonic free jets", Applied Physics Letters, vol. 75, No. 25, 20, Dec. 1999, pp. 3977-3979.

Lindner, "Ion beam synthesis of buried SiC layers in silicon: Basic physical processes", Nuclear Instruments and Methods in Physics Research, vol. 178, May 2001, pp. 44-54.

Wu et al., "The growth and characterization of silicon/silicon carbide heteroepitaxial films on silicon substrates by rapid thermal chemical vapor deposition", Japanese Journal of Applied Physics, Part 1, vol. 35, No. 7, Jul. 1996, pp. 3836-3840.

\* cited by examiner

SEMICONDUCTOR WAFER AND METHOD FOR MANUFACTURING THE SAME

TECHNICAL FIELD

An embodiment relates to the field of the electronics. More in detail, an embodiment relates to a process for manufacturing a semiconductor wafer.

BACKGROUND

An Integrated Circuit (IC) is an electronic circuit whose components are directly manufactured into a substrate of semiconductor material. The substrates of the great majority of the presently available ICs are obtained from wafers of silicon (Si).

Silicon wafers are usually formed of highly pure, monocrystalline silicon. A well-known manufacturing process for generating wafers of this type is the so-called "Czochralski growth process". More in detail, a seed crystal of silicon is introduced into a mass of melted silicon. Then, the seed is gradually pulled out from the melted silicon, while being slowly rotated. In this way, the amount of melted silicon collected by the seed cools off, forming a cylindrical ingot. The crystalline orientation of the resulting ingot is determined by the seed crystal. The ingot is then sliced with a saw (e.g., a wire saw) and polished to form wafers. In this way, it is possible to obtain silicon wafers in a variety of sizes, e.g., having diameters ranging from 25.4 mm (1 inch) to 300 mm (11.8 inches). ICs for power applications are typically manufactured on wafers having diameters of 6-8 inches.

Silicon carbide (SiC) wafers have been recently developed. Compared to silicon, SiC has different physical properties, at least partly due to the fact that SiC is a semiconductor having a wider energy bandgap than Silicon. The following table shows the values of the energy bandgap (Eg), the breakdown electric field (Ec), and the electron mobility ($\mu$) of Silicon and SiC, respectively:

|  | Silicon (Si) | Silicon Carbide (SiC) |
| --- | --- | --- |
| Eg | 1.1 eV | 3 eV |
| Ec | 30 V/$\mu$m | 300 V/$\mu$m |
| $\mu$[[M]] | 400 cm$^2$/Vsec | 40 cm$^2$/Vsec |

From the above table it can be observed that SiC has a higher breakdown electric field Ec. Therefore, SiC is a material that may be advantageously used for manufacturing electronic circuits for power applications, since a wafer (and, thus, an IC substrate) made in SiC is able to sustain relatively high voltages even with a relatively small thickness.

SiC wafers cannot be generated using the manufacturing process employed for forming silicon wafers, i.e., the Czochralski growth process. Indeed, SiC is a material that directly passes (sublimates) from the solid phase to the vapor phase, without passing through any liquid phase, the latter phase being instead required in the Czochralski growth process for forming the melting wherein the seed crystal is introduced.

A SiC wafer is usually produced starting from an already formed silicon wafer, and then by forming on a surface thereof a layer of SiC. The currently known methods for forming SiC wafers of this type are quite expensive, and do not guarantee high degrees of quality, especially from the crystal lattice point of view. More particularly, since the crystal lattice of silicon is different from that of SiC, the resulting SiC wafer is unavoidably subjected to a relatively pronounced warping (in jargon, "wafer bow", or simply "bow"). If the bow exceeds a certain threshold, the SiC wafer should be discarded, since the subsequent steps for integrating electronic devices in the wafer typically require a sufficiently planar wafer. Moreover, the largest wafer diameter currently obtainable by the known processes is limited to about 4 inches, i.e., roughly half of the diameter typically required for power applications. Similar drawbacks occurs as well by considering wafers made in other semiconductor materials like Gallium Nitride (GaN).

The paper "Growth of Si/3C-SiC/Si(100) heterostructures by pulsed supersonic free jets" by Y. Ikoma, T. Endo, F. Watanabe, and T. Motooka, Applied Physics Letters, vol. 75, no. 25, 20 Dec. 1999, pages 3977-3979, which is incorporated by reference, discloses a method for the epitaxial growth of multilayer structures of Si/3C-SiC/Si(100) by pulsed supersonic free jets of methylsilane (CH$_3$SiH$_3$) for SiC growth and trisilane (Si$_3$H$_8$) for Si growth.

The paper "Ion beam synthesis of buried SiC layers in silicon: Basic physical processes" by Jörg K. N. Lindner, Nuclear Instruments and Methods in Physics Research, vol. 178, May 2001, pages 44-45, which is incorporated by reference, provides a review of the basic physical processes leading to a distribution of amorphous and crystalline phases during high-dose, high-temperature, carbon implantation into silicon.

SUMMARY

The abovementioned processes known in the art for manufacturing wafers made in materials having a high breakdown electric field are typically too expensive, and are typically not satisfactory for providing wafers of quality having sufficiently large diameters and thicknesses, and having at the same time a sufficiently limited bow.

Therefore, presented herein is an embodiment that tackles the problem of how to produce a large-diameter wafer made in a material having a higher breakdown electric field, which exhibits reduced bow.

An embodiment relates to a method for manufacturing a semiconductor wafer. The method includes providing a monocrystalline silicon wafer, epitaxially growing a first layer of a first material on the silicon wafer, and epitaxially growing a second layer of a second material on the first layer. Said first material is monocrystalline silicon carbide, and said second material is monocrystalline silicon.

Said epitaxially growing the first layer includes carburizing a main surface of the silicon wafer for forming a film of monocrystalline silicon carbide, and epitaxially growing a monocrystalline silicon carbide layer from the film of monocrystalline silicon carbide.

According to an embodiment, said carburizing the surface of the silicon wafer includes exposing the silicon wafer to a precursor of the carbon for a first amount of time at a first temperature. Said epitaxially growing the monocrystalline silicon carbide layer from the film of monocrystalline silicon carbide includes exposing the silicon wafer to a precursor of the carbon and to a precursor of the silicon for a second amount of time at a second temperature higher than the first temperature.

For example, said providing a monocrystalline silicon wafer includes producing the monocrystalline silicon wafer by means of the Czochralski growth process.

Said monocrystalline silicon carbide layer may be grown to have a thickness, along a direction perpendicular to the surface of the silicon wafer, within approximately 2 to 6 µm.

According to an embodiment, said first temperature is within approximately 1120-1150° C., and said second temperature is within approximately 1370-1380° C.

According to an embodiment, said epitaxially growing the second layer includes exposing the silicon wafer to a precursor of the silicon at a third temperature that is approximately equal to 1120° C.

Another embodiment relates to a semiconductor wafer including a monocrystalline silicon wafer having a main surface, a first layer of a first material covering the main surface, and a second layer of a second material covering the first layer. Said first material is a high-breakdown-voltage monocrystalline material, and said second material is monocrystalline silicon.

BRIEF DESCRIPTION OF THE DRAWINGS

These and other features and advantages will be made evident by the following description of some exemplary and non-limitative embodiments thereof, to be read in conjunction with the attached drawings, wherein.

DETAILED DESCRIPTION

A method for manufacturing SiC wafers according to an embodiment will be now described in the following of the present description making reference to FIGS. 1-4. Specifically, each one of said figures is a sectional view of the wafer after a corresponding phase of the method.

Figure 1:
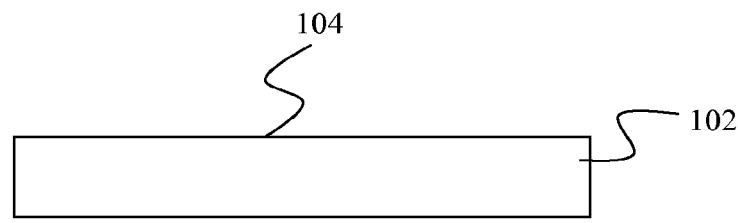
FIGS. 1-4 are sectional views of a semiconductor wafer after a corresponding phase of a method according to an embodiment has been carried out.

The first phase of the method provides for generating a monocrystalline silicon wafer—identified in FIG. 1 with the reference 102—using any one among the already-known silicon-wafer manufacturing processes. For example, the silicon wafer 102 may be a large-diameter silicon wafer obtained with the abovementioned Czochralski growth process.

The top surface 104 of the silicon wafer 102 is activated through a thermal treatment based on hydrogen or hydrochloric acid, or through a deposition of a silicon flash.

Figure 2:
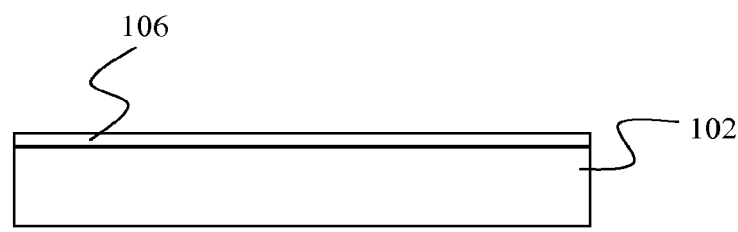

The next phase of the method according to an embodiment provides for carburizing the surface 104 of the silicon wafer 102 in order to create a thin film of monocrystalline SiC, for example of the 3C cubic crystalline form, to be used as a seed for the growth of a subsequent SiC layer. Specifically, the silicon wafer 102 is inserted into a reaction chamber, wherein it is exposed to a precursor of the carbon diluted in a carrier gas, such as hydrogen, for few minutes at a relatively high temperature, such as in a range of approximately 1120-1150° C. In this way, as illustrated in FIG. 2, the precursor of the carbon reacts with the silicon wafer 102, generating a film of SiC 106 on the surface 104 of the wafer. The resulting SiC film 106 has a relatively small thickness, on the order of few nanometers.

Figure 3:
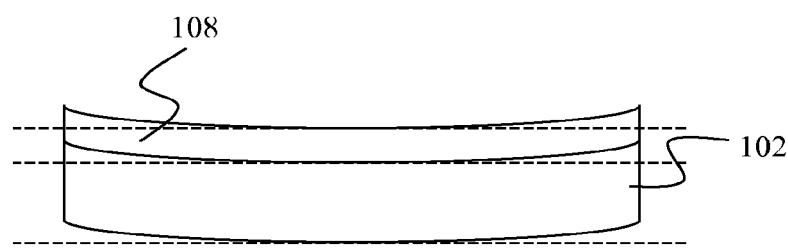

According to an embodiment, after the formation of the film 106, a precursor of the silicon is added to the precursor of the carbon, and the temperature of the reaction chamber is increased up to a temperature within a range of approximately 1370-1380° C. In this way, as illustrated in FIG. 3, a layer 108 of monocrystalline SiC is epitaxially grown from the film 106. Since the film 106 acts as a seed for the growth of the SiC layer 108, the latter takes the same crystalline form of the former (in the considered example, the 3C cubic crystalline form). The thickness of the resulting SiC layer 108 is determined by the amount of time the wafer is exposed to the silicon and carbon precursors within the reaction chamber; a thickness suitable for the use in power applications (i.e., able to sustain relatively high voltages) may, for example, in a range of approximately 2-6 µm.

Since the crystal lattice of the silicon wafer 102 is different from the crystal lattice of the SiC layer 108, the resulting wafer structure may be subjected to a relatively pronounced warping (bow). For example, for a SiC layer 108 having a thickness within a range of approximately of 2-6 µm, such bow may approximately range from 90-100 µm, where the bow is a height measured from the lowest point of the bow to the highest point of the bow, where the lowest point is at approximately the center of the layer 108, and where the highest point is at approximately the edge of the layer 108.

According to an embodiment, the bow originated from the presence of the SiC layer 108 is reduced by further epitaxially growing a layer of monocrystalline silicon on the SiC layer 108. In order to generate such layer of silicon, identified in FIG. 4 with the reference 110, the wafer is exposed to a precursor of the silicon at a temperature of approximately 1120° C. For example, in order to allow the formation of the active area and/or the channel of a power MOS transistor, the silicon layer 110 may range from approximately 1-3 µm. In an embodiment, this phase may be quite critical, and the corresponding process parameters—such as the carbon-silicon ratio, the temperature, and the growth rate—may need to be carefully set.

Figure 4:
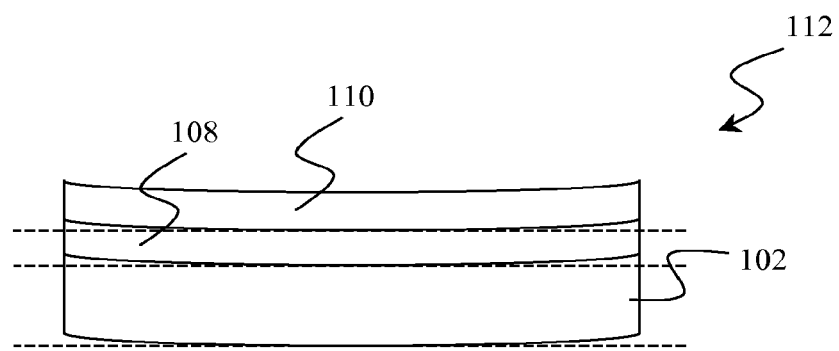

As illustrated in FIG. 4, the presence of the silicon layer 110 reduces the bow to a lower extent. Making reference to the example at issue, the resulting bow may be reduced by approximately 50 µm or more, e.g., to approximately 20-30 µm. In this way, the resulting SiC wafer, globally identified in Figure with the reference 112, is typically sufficiently planar for being subjected to a subsequent planar manufacturing process for the integration of electronic devices.

Thanks to its peculiar structure, the SiC wafer 112 has both the advantages provided by the SiC (high breakdown electric field, low resistance) and at the same time the advantages provided by a surface layer made in silicon (high mobility, junctions formation).

ICs may be integrated in the SiC wafer 112 in the same way as in a standard silicon wafer; therefore, SiC wafers obtained with the method according to an embodiment can be employed in any already-existing manufacturing plant designed for the integration of electronic circuits in silicon wafers.

And such an IC may form part of a system in which the IC is coupled to one or more other ICs such as a computing-apparatus IC. Examples of such a system include computer systems and smart phones, and examples of such a computing-apparatus IC include microcontrollers and microprocessors.

The manufacturing costs of an embodiment of the proposed method are lower than in the known SiC manufacturing processes. Moreover, with an embodiment of the proposed method it is possible to obtain wafers having diameters that reach approximately 6-8 inches.

According to an embodiment, the starting wafer 102 is made of intrinsic silicon. According to a further embodiment, the starting wafer 102 is made of doped silicon, either of the n (particularly, n+) or of the p (particularly, p+) type;

in this case, the SiC layer 108 and the silicon layer 110 may include dopants of the p or n type, depending on the devices to be integrated.

The previous description presents and discusses in detail several embodiments; nevertheless, several changes to the described embodiments, as well as different embodiments are possible, without departing from the scope of the disclosure.

For example, even if reference has been made to a semiconductor wafer including a layer of SiC, similar considerations apply in case a different material is employed in the layer, such as, for example, Gallium Nitride (GaN).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method for making a semiconductor wafer comprising:
providing a substrate comprising monocrystalline silicon;
forming a silicon carbide layer over the substrate; and
epitaxially forming a monocrystalline silicon layer over the silicon carbide layer;
the substrate, the silicon carbide layer, and the monocrystalline silicon layer having a bow less than 30 μm.

2. The method of claim 1 further comprising adding dopant to the substrate.

3. The method of claim 1 further comprising adding dopant to the silicon carbide layer.

4. The method of claim 1 further comprising adding dopant to the monocrystalline silicon layer.

5. The method of claim 1 wherein the silicon carbide layer has a thickness in a range of 2-6 μm.

6. The method of claim 1 wherein the silicon carbide layer comprises a monocrystalline silicon carbide layer.

7. The method of claim 1 wherein the silicon carbide layer comprises a 3C silicon carbide layer.

8. The method of claim 1 wherein the monocrystalline silicon layer has a thickness in a range of 1-3 μm.

9. The method of claim 1 wherein the substrate, the silicon carbide layer, and the monocrystalline layer have a bow in a range of 20-30 μm.

10. The method of claim 1 wherein the substrate, the silicon carbide layer, and the monocrystalline layer have a diameter in a range of 6-8 inches.

11. A method of making a semiconductor wafer comprising:
providing a substrate of monocrystalline silicon;
forming a silicon carbide layer over the entire substrate; and
forming a monocrystalline silicon layer consisting of monocrystalline silicon over the entire silicon carbide layer;
the substrate, the silicon carbide layer, and the monocrystalline silicon layer having a bow less than or equal to 30 μm.

12. The method of claim 11 further comprising adding dopant to the substrate.

13. The method of claim 11 further comprising adding dopant to the silicon carbide layer.

14. The method of claim 11 further comprising adding dopant to the monocrystalline silicon layer.

15. The method of claim 11 wherein the silicon carbide layer has a thickness in a range of 2-6 μm.

16. The method of claim 11 wherein the silicon carbide layer comprises a monocrystalline silicon carbide layer.

17. The method of claim 11 wherein the silicon carbide layer comprises a 3C silicon carbide layer.

18. The method of claim 11 wherein the monocrystalline silicon layer has a thickness in a range of 1-3 μm.

19. The method of claim 11 wherein the substrate, the silicon carbide layer, and the monocrystalline layer have a bow in a range of 20-30 μm.

20. The method of claim 11 wherein the substrate, the silicon carbide layer, and the monocrystalline layer have a diameter in a range of 6-8 inches.

21. A method for making a semiconductor wafer comprising:
providing a substrate comprising monocrystalline silicon;
forming a silicon carbide layer over the substrate and having a thickness in a range of 2-6 μm; and
epitaxially forming a monocrystalline silicon layer over the silicon carbide layer and having a thickness in a range of 1-3 μm;
the substrate, the silicon carbide layer, and the monocrystalline silicon layer having a bow in a range of 20-30 μm.

22. The method of claim 21 further comprising adding dopant to the substrate.

23. The method of claim 21 further comprising adding dopant to the silicon carbide layer.

24. The method of claim 21 further comprising adding dopant to the monocrystalline silicon layer.

25. The method of claim 21 wherein the silicon carbide layer comprises a monocrystalline silicon carbide layer.

26. The method of claim 21 wherein the silicon carbide layer comprises a 3C silicon carbide layer.

27. The method of claim 21 wherein the substrate, the silicon carbide layer, and the monocrystalline layer have a diameter in a range of 6-8 inches.

* * * * *